United States Patent
Perner

(10) Patent No.: US 11,238,948 B2
(45) Date of Patent: Feb. 1, 2022

(54) TESTING MEMORY CELLS BY ALLOCATING AN ACCESS VALUE TO A MEMORY ACCESS AND GRANTING AN ACCESS CREDIT

(71) Applicant: Infineon Technologies AG, Neubiberg (DE)

(72) Inventor: Martin Perner, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 17/168,310

(22) Filed: Feb. 5, 2021

(65) Prior Publication Data
US 2021/0158882 A1 May 27, 2021

Related U.S. Application Data

(63) Continuation of application No. 16/109,185, filed on Aug. 22, 2018, now Pat. No. 10,916,322.

(30) Foreign Application Priority Data

Aug. 24, 2017 (DE) .......................... 102017119426.6

(51) Int. Cl.
*G11C 29/02* (2006.01)
*G11C 29/10* (2006.01)
(Continued)

(52) U.S. Cl.
CPC .............. *G11C 29/02* (2013.01); *G11C 29/08* (2013.01); *G11C 29/10* (2013.01); *G11C 29/16* (2013.01);
(Continued)

(58) Field of Classification Search
CPC .......... G11C 29/02; G11C 29/08; G11C 29/76
(Continued)

(56) References Cited

U.S. PATENT DOCUMENTS 5,515,523 A * 5/1996 Kalkunte ................ G06F 13/18
710/240
6,662,278 B1 12/2003 Kahn et al.
(Continued)

OTHER PUBLICATIONS

Office Action dated Feb. 13, 2019 for German Patent Application No. 102017119426.6.

*Primary Examiner* — Connie C Yoha
(74) *Attorney, Agent, or Firm* — Schiff Hardin LLP

(57) ABSTRACT

A method for testing memory cells under test of an integrated circuit includes allocating an access value to a memory access and granting an access credit. If the access value of the memory access does not exceed the access credit, the memory access is performed and the access credit is reduced by the access value. The memory access is performed to one memory cell or at bit level to a plurality of memory cells. A processor is connectable to a memory having a plurality of memory cells. The processor is configured to test memory cells of a protected memory area of the memory by performing memory accesses at bit level, control a counting register in such a way that a value stored in the counting register is modified according to a number of performed memory accesses, and test memory cells of the protected memory area of the memory only if the value stored in the counting register lies within a permissible value range.

12 Claims, 7 Drawing Sheets

(51) Int. Cl.
  *G11C 29/08* (2006.01)
  *G11C 29/42* (2006.01)
  *G11C 29/16* (2006.01)
  *G11C 29/36* (2006.01)
  *G11C 29/00* (2006.01)

(52) U.S. Cl.
  CPC .............. *G11C 29/36* (2013.01); *G11C 29/42* (2013.01); *G11C 29/76* (2013.01); *G11C 2029/3602* (2013.01)

(58) Field of Classification Search
  USPC .................. 365/185.09, 201, 230.01, 185.03
  See application file for complete search history.

(56) References Cited

U.S. PATENT DOCUMENTS

| | | |
|---|---|---|
| 9,536,111 B2 | 1/2017 | Sibert |
| 2005/0235308 A1 | 10/2005 | Dellow et al. |
| 2007/0283113 A1 | 12/2007 | Grunkemeyer et al. |
| 2014/0317360 A1 | 10/2014 | Campbell |

* cited by examiner

TESTING MEMORY CELLS BY ALLOCATING AN ACCESS VALUE TO A MEMORY ACCESS AND GRANTING AN ACCESS CREDIT

The present disclosure relates to memory devices with memory cells for storing information. In particular, the present disclosure relates to a method and an apparatus for testing memory cells of an integrated circuit.

With regard to an embedded memory area of a computing unit, it may be necessary to test cells of the memory area in respect of the programming capability of the respective cell in order to establish whether information can be reliably recorded in the respective cell, the cell reliably stores the recorded information, and whether the information can be reliably read from the cell.

A check code can be used to detect any restriction of the functional capability of the cells under test. To do this, the check code is formed on the basis of the information which is to be written to the cells under test and is written to, stored in and read from the cells under test jointly with the information. If the read check code does not match the read information, this indicates a functional restriction.

A prerequisite of the test method described above is that the information which is stored in the cells under test is known. The applicability of the method is thus restricted to memory registers with cells whose stored information does not have to remain secret.

In one respect, the disclosure relates to a method for managing access to a memory. The method comprises allocating an access value to a memory access and granting an access credit. The method furthermore comprises performing the memory access and reducing the access credit by the access value only if the access value of the memory access does not exceed the access credit.

In one respect, the disclosure relates to a method for testing memory cells under test of an integrated circuit. The method comprises: allocating an access value to a memory access and granting an access credit. The method furthermore comprises: determining a first signature on a data word segment of a first bit sequence and writing the data word segment of the first bit sequence to the memory cells under test. The method furthermore comprises: reading a second bit sequence from the memory cells under test and reducing the access credit by the access value only if the access value of the memory access does not exceed the access credit. The method furthermore comprises: forming a second signature on the data word segment of a second bit sequence and signaling if the second signature is different from the first signature, and/or signaling if the second signature matches the first signature.

In one respect, the disclosure relates to a processor which is connectable to a memory having a plurality of memory cells. The processor is configured to control a counting register in such a way that a value stored in the counting register is modified according to a number of performed tests. The processor is furthermore configured to test memory cells of the protected memory area of the memory only if the value stored in the counting register lies within a permissible value range.

The independent claims define general embodiments in different respects. The dependent claims specify features of embodiments in different respects.

The attached drawings form part of the present disclosure in order to enable a broader understanding. The drawings represent embodiments and, together with the description, serve to explain basic concepts of the disclosure.

The features of the drawings are not necessarily shown to scale in relation to one another. Similar reference numbers denote similar parts which correspond to one another. Other embodiments and a number of the envisaged advantages will become immediately obvious with reference to the following detailed description. It should be understood that other embodiments can be used and structural and/or logical modifications can be made to the example embodiments. Example embodiments, embodiments and associated effects are described below with reference to the attached drawings.

Generally speaking, a processor is connectable to a memory having a plurality of memory cells under test. The processor is configured to test memory cells of a protected memory area of the memory.

Figure 1:
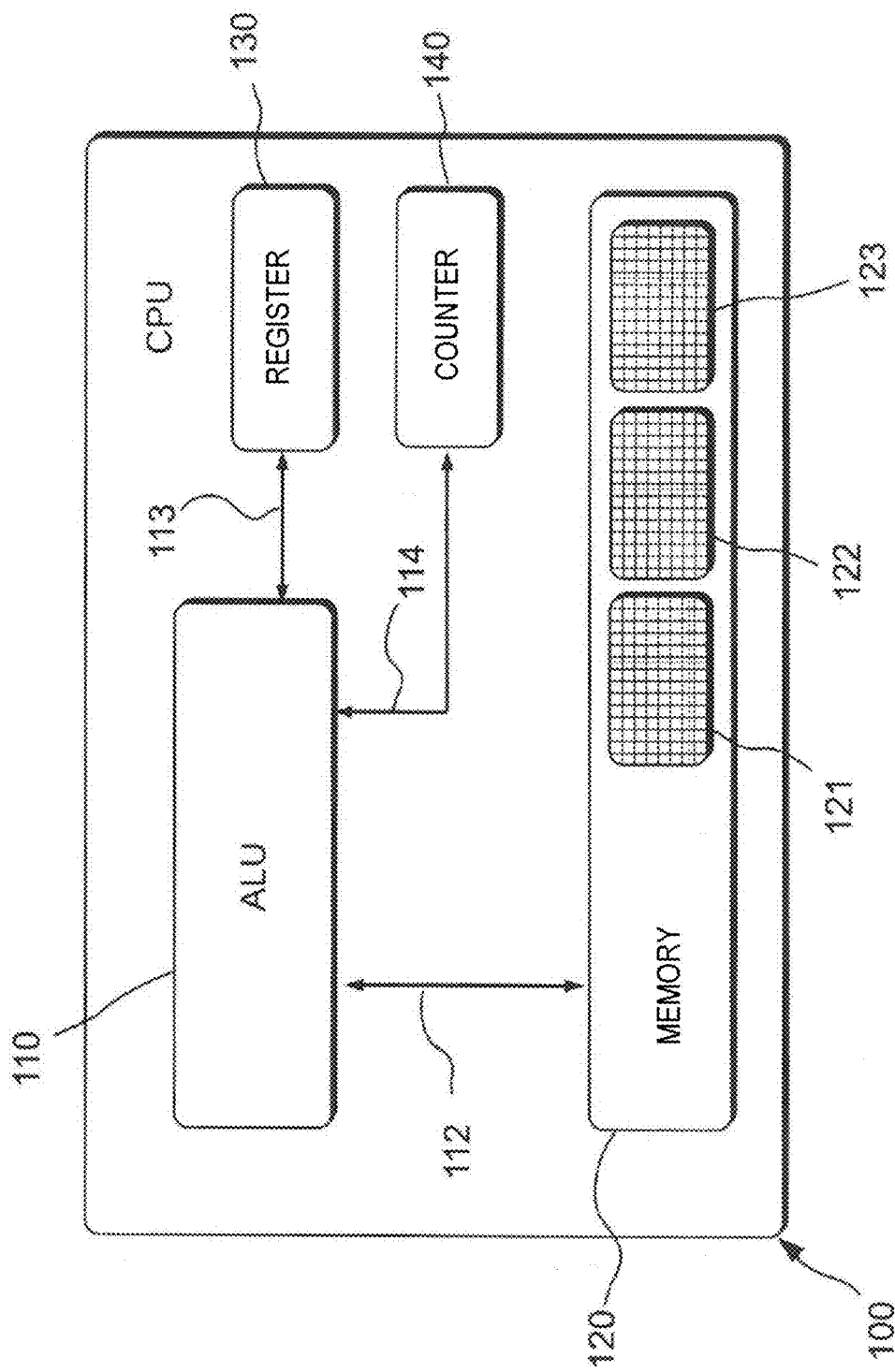
FIG. 1 is a block diagram which schematically represents a processor according to some embodiments.

FIG. 1 is a block diagram which schematically represents a processor according to some embodiments. In one embodiment, a processor 100 is configured as an integrated circuit with a processor core. In a different embodiment (not shown), the processor has a plurality of processor cores.

The processor 100 has an arithmetic logic unit (ALU) 110. The processor 100 furthermore has a memory 120. The memory 120 is connected to the ALU 110 in such a way, for example by means of a data bus 112, that the ALU 110 can write data to the memory or can read data from the memory 120. In some embodiments, the processor 100 and the memory 120 are integrated in a circuit. The memory 120 is configured, for example, as an embedded memory. This means that memory cells of the memory 120 form part of the same integrated circuit of the processor core which also comprises the ALU 110. In a different embodiment (not shown), the memory is connected to the processor, but without forming part of the processor. The memory is configured, for example, as a physically separated block of the integrated circuit with the processor, said integrated circuit being connected to the memory by lines. In some embodiments, the memory 120 is configured as non-volatile. In particular, the memory 120 comprises non-volatile memory cells. In some embodiments, the memory 120 has a plurality of memory blocks, referred to herein as memory sectors 121, 122, 123.

In some example embodiments, the processor 100 furthermore comprises registers 130 for special purposes. The registers 130 for special purposes are connected to the ALU 110 in such a way, for example by means of a data line 113, that the ALU 110 can write data to the registers 130 for special purposes or can read data from the registers 130 for special purposes. In some example embodiment (not shown), the ALU 110 contains the registers for special purposes.

In some embodiments, the processor 100 is generally protected against unauthorized third-party access. The processor 100 is, for example, password-protected, i.e. the processor 100 is configured to prevent a user from reading data which are stored in protected registers, such as, for example, the register 130 for special purposes. At least one effect may be that the user, without knowing a password, is unable to analyze contents of protected registers and processes in the processor 100 which use the protected registers. In some embodiments, the protection also extends, for example, to the memory 120 which is connected to the processor 100. The protection may cover the entire memory 120, one or more sectors 121, 122, 123 of the memory 120, or one or more addresses in the memory 120. In some embodiments, the processor 100 can receive commands from the user despite the protection and can execute with the restriction that protected registers cannot be read or data cannot be output from the protected registers to the user.

In some embodiments, the processor 100 comprises a counting register 140. In some embodiments (not shown), one of the registers 130 for special purposes is configured as the counting register 140. In some embodiments, the counting register is connected by means of a control line 114 to the ALU 110. By means of the control line, the ALU 110 can increment or decrement a counter value which is stored in the counting register 140, and/or can reset it to a starting value. The counting register 140 has a length, for example, of 16 bits.

The processor 100 is generally configured to control the counting register 140 in such a way that a value stored in the counting register 140 is modified according to a number N of performed tests. For example, a starting value S in the 16-bit counting register is 0 0 0 0 1 1 1 1 1 1 1 1 1 1 1 1. In one embodiment, the processor 100 is generally configured to reduce the counter value stored in the counting register 140 in each case by 1 with each performed test.

In some embodiments, the processor 100 is configured to control the counting register 140 in such a way that the value stored in the counting register 140 is modified according to an access value D of the performed memory access. In one embodiment, the access value D is defined for a reading of an individual bit from the data segment at an address in the memory 120. In one example, the access value D is equal for each access, e.g. the access value D can always be 1. In a different example, the access value D is dependent on the bit position at which the access is performed. The access value Dmsb=2, for example, can be allocated to an access to a bit at the leading bit position, whereas the access value Di=1 is allocated to an access to another bit at the i-th bit position i<msb.

The processor 100 is configured, in particular, to test memory cells of the protected memory area of the memory 120 only if the value stored in the counting register 140 lies within a permissible value range C=[Cmin . . . Cmax]. The permissible value range C is also referred to herein as "credit". In particular, the permissible value range C can be defined as Cmin>0.

So that an access can be performed, in one embodiment in which the counting register 140 is reduced from the starting value S by the access value D, the lower limit Cmin of the permissible value range must not be understepped, so that the memory access is permitted and thus avoids being blocked, for example, by the ALU 110.

In some embodiments, the ALU 110 can read the counter value from the counting register 140 and process it.

In some embodiments, the processor comprises a state machine. In particular, the processor 100 can be configured as a state machine. In some embodiments, the processor 100 has the state machine as an embedded component. The state machine is allocated, for example, to an address area of the memory 120 and is configured to perform an addressing of the memory 120 according to a memory addressing request, for example from the ALU 110.

In some embodiments, the state machine is configured to perform a deletion procedure in respect of an addressed address area, such as, for example, a memory cell in the memory 120, a memory sector of the memory 120, a memory page of the memory 120 or the entire memory 120. In some embodiments, the state machine is configured to program the memory 120, i.e., for example, electively a specific memory cell of the memory 120, according to a predefined sequence of programming steps to a memory value so that the memory value is stored in the memory. At least one effect may be that the state machine is able to receive data from the memory 120, but at the same time is predefined with regard to the processing of the received data in such a way that the processing is not carried out exclusively in accordance with a program command sequence, but in accordance with a circuit which is implemented in the state machine. In one embodiment, the state machine is configured in such way that data which are read from a selected area of the memory 120 are not transferred to the ALU 110. In one embodiment of the state machine, data which are read from a selected area of the memory 120 cannot be transferred at all to the ALU 110. At least one effect may be that data from the selected area of the memory 120 are forwarded for processing to the state machine, but not additionally to the ALU 110 also.

In one embodiment, the state machine is configured to provide a signature, such as, for example, a checksum, an error correction code (ECC) or the like, on read data.

In some embodiments, the processor 100 is configured as resistant to unauthorized access. The processor 100 has, for example, means such as a randomization of memory accesses and/or other processes which hinder a differential power analysis. The processor 100 may have a field shielding to hinder a reading of data using electric field probes. Other protection measures are known to the person skilled in the art for hindering access to data which are stored in the memory 120 of the processor 100 and/or which are processed by the processor 100.

Figure 2:
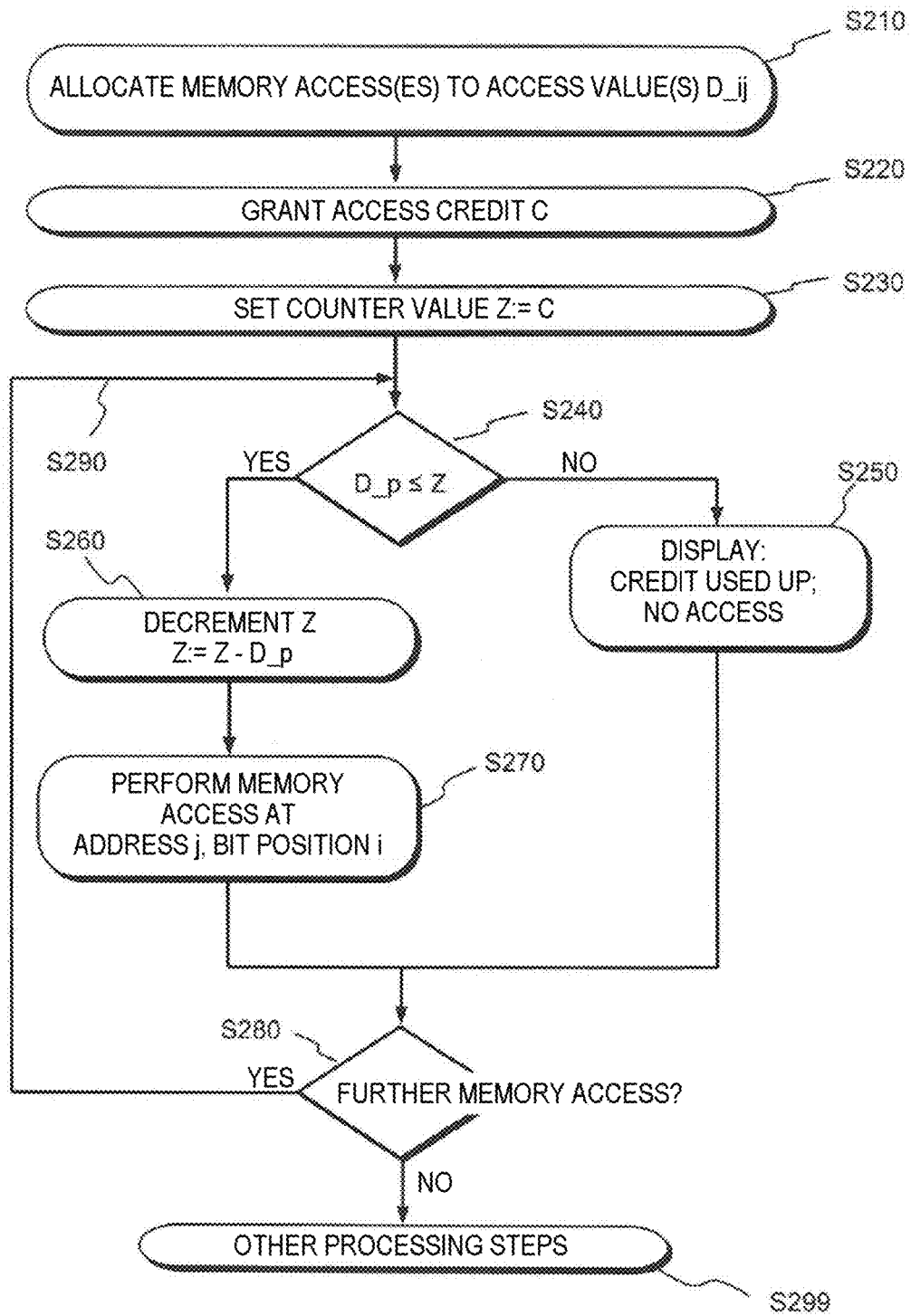
FIG. 2 shows a flow diagram which schematically represents a method according to some embodiments.

FIG. 2 shows a flow diagram which schematically represents an example of a method according to some embodiments. An example of an implementation of the method is explained below using the processor 100 shown in FIG. 1 according to some embodiments, wherein reference is made to the flow diagram shown in FIG. 2.

Generally speaking, a method for managing accesses to a memory 120 comprises a step according to which a memory access is allocated to an access value D. Depending on the context, the abbreviation D is used herein for the access value, without indices if indices are irrelevant in terms of the explained subject-matter. The abbreviation D is used with indices if the indices are conducive to a better understanding.

The memory access can be performed in multiple steps, i.e. the memory access comprises a plurality of steps, as will be explained below with reference to examples. In particular, the memory access may comprise a step according to which the processor 100 outputs a result which represents information obtained during the memory access. The memory access is not performed completely before the result is output. Accordingly, the wording "blocking of the memory access" also covers embodiments in which one step or a plurality of steps of the multi-step memory access are carried out, but the memory access is not performed completely in that, for example, the output of the result is blocked.

In the example embodiment shown in FIG. 2, S210 defines how a memory access is to be evaluated. The definition can be performed at bit level. Accordingly, in one embodiment, the access value $D\_{ij}$ for a bit at an i-th bit position at a j-th address can be individually defined. The definition can also take account of the access type. It can be defined, for example, that a read access to a most significant bit at the j-th address of the memory 120 is weighted twice as heavily as a read access to the other bit positions at the j-th address. This means, for example, in a case where the memory is configured to store data words having a maximum width of 16 bits, that the read access to the bit position 15 is evaluated twice as highly as the read access to the other bit positions 0 . . . 14, in other words: $D\_15j=2$ and $D\_kj=1$ where $k=0$ . . . 14. A different evaluation can be defined for a write access; in the present example, write accesses for all bit positions can be evaluated, for example, as 3.

At S220, the method furthermore comprises granting an access credit C. The significance of the access credit C is explained in the description of example embodiments of the further method. Generally speaking, a planned memory access is carried out in the method if the access value D_p of the planned memory access does not exceed the access credit C. The memory access is blocked accordingly if the access credit C is not sufficient, i.e. if the access credit C is less than the access value D_p of the planned memory access.

In one embodiment with multi-step memory access, the access value D is not allocated, for example, until at least one step of the multi-step memory access is carried out. In particular, the multi-step memory access comprises an evaluation. The access value is allocated to the memory access, for example, on the basis of an information content resulting from the evaluation of the memory access. The information content may depend, in particular, on a ratio of a number of ones (or zeros) to a number of bit positions which are subjected to a respective step of the memory access. In particular, the access value can be allocated on the basis of the information content in relation to a query which the user seeks to answer by means of the memory access. At least one effect may be to enable an allocation of the memory access to an access value which takes particular account of the interest of the user.

In some embodiments, the lower a number of possible combinations is in terms of the states of the memory cells at the bit positions which are subjected to the memory access with regard to a result of the memory access, the greater the access value D of a memory access generally is. The lower a number of memory accesses has to be, the higher an access value D can accordingly be in order to be able to determine, with a given confidence on the basis of collected results of the memory accesses, the states of the memory locations affected by the access. For example, a first test access may comprise forming a checksum over a 16-bit data word segment at a first address under test in the memory 120. If it is assumed, for example, that the result is 3, this means that the value 1 has been read at three bit positions of the address under test. A second test access may comprise forming a checksum over the 16-bit data word segment at a second address under test in the memory 120. If it is assumed, for example, that the result is 0, this means that the value 0 has been read at all bit positions of the data word segment. The information content of the second checksum is higher than the information content of the first checksum since, with regard to the first checksum, the bit positions of the three read values 1 are unknown, whereas, with regard to the second checksum, the bit positions of the 16 read values 0 are known. A higher access value is thus retrospectively ascribed to the second result or the second memory access than to the first memory access, and for this reason the credit C is more substantially reduced by the second memory access than by the first memory access.

In one embodiment, at S230, the counter reading Z in the counting register 140 is set to the access credit C. The counter reading Z thus represents the available access credit C.

Since the planned memory access is performed only if the access value D_p of the planned memory access does not exceed the access credit C, a check is carried out in one embodiment of the method at S240 to determine whether the counter reading Z which represents the available access credit C is at least as high as the access value D_p of the planned memory access. It is assumed, for example, that the access value D_p=3, for example, is allocated to a planned read access. The credit is assumed to be C=2. Since D_p>C in this example, the processor 100 blocks the planned read access. In some embodiments, as shown, for example, in FIG. 2 at S250, it is indicated accordingly to a user, for example through the output of a corresponding signal bit, that the credit C is used up and no access is performed if the access value D_p of the planned memory access exceeds the access credit C.

Generally speaking, in some embodiments, when the memory access is performed, the access credit C is modified according to the allocation of the memory access to the access value D. In the embodiments explained above, for example, the counter reading Z of the counting register 140 is decremented at S260 with each access to the memory 120. In the example embodiment explained above, the counter reading Z of the counting register 140 thus corresponds following the decrement to the credit C following the performance of the memory access.

An embodiment is also possible in which a lower threshold value Tmin is provided, below which the counter reading Z in the counting register 140 must not fall in order to still allow the planned memory access. In this embodiment, the credit C is C=Z−Tmin.

Conversely, in one variant, the counting register 140 is incremented with each access to the memory 120. A check is carried out accordingly in this variant to determine whether a counter reading Z, plus the access value D_p of the planned memory access, does not exceed a maximum threshold value Tmax. The significance of the minimum threshold value Tmin is ascribed here to the maximum threshold value Tmax of those embodiments in which the counting register 140 is decremented according to the access value D. A difference between the maximum threshold value Tmax and the counter reading Z thus corresponds to the access credit C. In one embodiment in which the counting register 140 incremented, a check is therefore carried out to determine whether the counter reading Z of the counting register 140, plus the access value D_p which is allocated to the planned memory access, does not exceed the threshold value Tmax=Z+C. If D_p<=C, the processor 100 blocks the memory access in any event, not for want of credit.

In the example embodiment of the method shown in FIG. 2, the processor 100 accesses a bit position i in the memory 120 at an address j at S270. The memory access is, for example, a read access, in which the processor reads a bit value of the bit position i from the memory 120. In one embodiment, the memory access is performed and the access credit C which is represented, for example, by the counter reading Z of the counting register 140 is modified in pairs by the access value D. In one embodiment, the processor 100 is configured to increment the counter reading Z at S260 and simultaneously perform the read access to the memory 120 at S270. In some embodiments, the processor 100 carries out the steps at S260 and at S270 successively, wherein the sequence in which the steps are carried out is irrelevant in terms of the underlying concept. At least one effect may be that the counter reading Z of the counting register 140 is modified only if the memory 120 is accessed, and that the memory access is performed only if the counter reading Z of the counting register 140 is modified according to the access value D of the performed memory access.

At S280, a check is carried out in some embodiments to determine whether a further memory access is intended to be performed. In the example described above, a check can be carried out, for example, to determine whether a further bit value is intended to be read from the memory 120. The user prompts the processor 100, for example, to read a further bit value from the memory 120. If a further bit value is intended to be read, the sequence reverts at S290 to the query at S240, according to which a check is again carried out to determine whether the access value D_p of the planned access does not exceed the still available credit C, which is represented in the example shown by the counter reading Z of the counting register 140. Conversely, if no further bit value is intended to be read, the processor 100 carries out other processing steps at S299. In one embodiment, read bit values are statistically analyzed in order to draw a conclusion, for example, in respect of a property of the memory 120, for example in terms of individual read memory cells.

The memory access at S270 is selected, for example, from a group of access types which consists of read access, write access and test access. In one example, a read access is chosen. A memory area of the memory 120 can generally be made electively accessible for the memory access. Conversely, the memory 120 is blocked against memory access if the memory access relates to a memory cell which is disposed outside the memory area for the memory access.

In some embodiments, the processor 100 controls the access, for example, by means of a mask in such a way that only bits at bit positions at an address in the memory which are released for reading by the mask are read. The mask can provide, for example, that only a read access to the most significant bit of an address in the memory 120 is intended to be permitted. The mask can be implemented, for example, by means of a mask word which, in the memory access, defines the bit positions at which the memory access is performed, i.e. the bit values of a data word which are to be read at the chosen address from the memory 120. The restriction of the access to the defined bit positions is implemented, for example, by means of an AND operation of the mask word with a data word received from the memory.

Embodiments of the method in which the memory access to a memory cell of the memory 140 is performed electively are examined in more detail below. It is assumed, for example, that a read access is provided to three bit positions of a data word which is stored at the j-th address in the memory 120. The credit is assumed to be C=2, the access value $D_{ij}$ is assumed to be $D_{ij}=1$ for each bit position; the access value D_p of the planned read access is thus D_p=3 in total. In some embodiments, the access credit is related to a predefined segment of the memory 120. In some embodiments, a user can define the access credit at bit level. The user can accordingly define, for example, a number of accesses in order to carry out a test according to which a bit value is read at a bit position defined by the user within a sector of the memory 120 defined by the user at an address defined by the user. The definition can provide, for example, that only one or more specific bit positions of a memory and only at one or more specific addresses have a sufficiently low access value to lie always above each possible access credit and thus de facto allow no access.

Generally speaking, the smaller the number of bit positions which are subjected to the memory access, the greater the information content of a result of the memory access. The access value can be allocated accordingly at bit level to a planned memory access in such a way that, the smaller the number of bit positions to which the planned the planned memory access is intended to be performed, the higher the access value D_p which is allocated to the planned memory access.

In some embodiments, the access value is measured according to an information content which, for example, the read access to the selected bit positions in the memory 120 reads. A redundancy of the data stored in the memory 120 at the address provided for the read access can be taken into account in defining the access value. A read access, for example, to two bit positions in a 16-bit wide memory can be evaluated in a first case in which the data are stored without redundancy in the 16-bit wide memory as lower than in a second case in which the data are stored with redundancy in the 16-bit wide memory, i.e. if, for example, six of the 16 bit positions are therefore provided for storing an error correction code (ECC). In the first case, the relative information gain through the reading of two bits is less than in the second case.

In some embodiments in which a memory access is performed in multiple stages and, for example, a first step k=1 encompasses an entire data word, whereas a subsequent step k=2 concerns only a data word segment whose width is less than the full width of the data word, the access value D_p can consist of a plurality of components $D_{pk}$, wherein each component $D_{pk}$ is determined, for example, on the basis of the number of bit positions concerned by the step of the memory access to which the component $D_{pk}$ is allocated.

Generally speaking, a memory access can be performed for evaluation only, wherein, for example, a state which is stored in the memory cell on which the memory access is performed is read but not modified. In some embodiments, the memory access is performed to carry out a modification. Here, the state of the memory cell on which the memory access is performed is modified.

In some embodiments, the memory access concerns memory cells at addresses at which data are stored in error-corrected form. A data word, including an error correction code, is stored, for example, at a given address in the memory. In some embodiments, the memory access comprises a plurality of steps, wherein at least one step entails inverting a read bit value within a data word segment at a predefined bit position in the memory in order to induce an error correction in relation to the modified data word. In a further step, the error correction code of the modified data word is read. The user can evaluate the error correction code, for example, in order to determine an indication of a memory cell which is not correctly programmable.

When a test is carried out, the test access is performed in some embodiments within a protected memory area. The performance may comprise reading a first state of the memory cell. The performance may comprise writing the first state of the memory cell to a free memory cell. A second state which differs from the first state can furthermore be written to the memory cell. In one embodiment, a third state of the memory cell is then read. Finally, a check can be carried out to determine whether the third state corresponds to the second state. The third state can be compared, for example, with the second state in order to establish whether the second state of the memory cell and the third state of the memory cell differ in such a way that, when the state is read, the second state is allocated to a first value and the third state to a second value, said values differing from one another. In some embodiments, the performance of the test access within the protected memory area comprises writing the first state to the memory cell. In some embodiments, following the performance of the test, the free memory cell is read accordingly in order to read a value which the first state represents. The value can then be written back to the memory cell which was subjected to the test.

In some embodiments, the memory 120 is configured to output a signal which indicates if the third state corresponds to the second state, and/or which indicates if the third state differs from the second state. In some embodiments, the performance of the test access within the protected memory area comprises receiving, from the protected memory area, the signal which indicates if the third state corresponds to the second state and/or which indicates if the third state differs from the second state.

Examples in which the access credit C is used in relation to a read access have been cited above. In some embodiments, the access credit can also be used in relation to other access types. In one variant (not shown), a plurality of access credits C1, C2, . . . are defined in order to be used in relation to different access types. Instead of or in addition to the read access, for example, an access value D of a second type which is determined or defined independently from the access value D of a first type, i.e. for the read access, can be defined for test accesses. In some embodiments, the access value D for test accesses T is defined at bit level as described above in relation to the access value D for read accesses.

In some embodiments, the access credit is defined depending on a different parameter. The access credit can be defined, for example, depending on a user class of the user (such as "customer", "manufacturer", "other"). In another example, the access credit is defined depending on a location (e.g. Stuttgart, Munich, other location) at which the processor 100 which performs the memory access is sited. The access credit can be defined, for example, depending on a retrieval frequency or depending on a period of time which has elapsed between a current session and an earliest session in which a past memory access was performed. The access credit can be defined taking into account or on the basis of combinations of values of different parameters such as, in particular, the above-mentioned parameters.

Some embodiments in which tests of the memory 120 can be carried out bit-by-bit are explained below by way of example. In the examples described, data words or data word segments are read and written at selected addresses in the memory 120, as will be explained below in the detailed description with reference to FIGS. 3A, 3B, 3C and 4A and 4B.

Figure 3A:
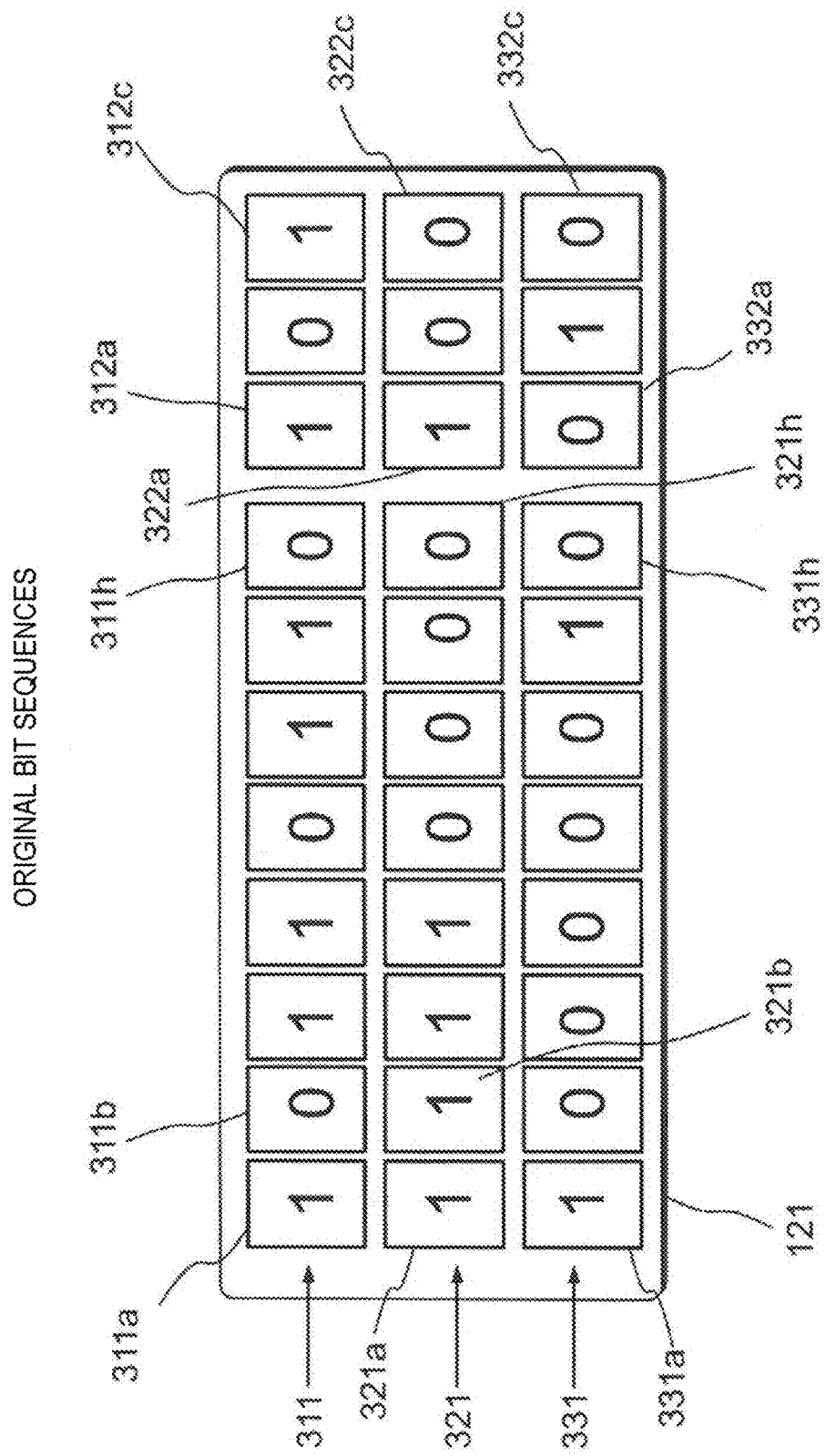
FIGS. 3A, 3B and 3C are block diagrams which schematically represent a memory sector according to some embodiments.
Figure 3B:
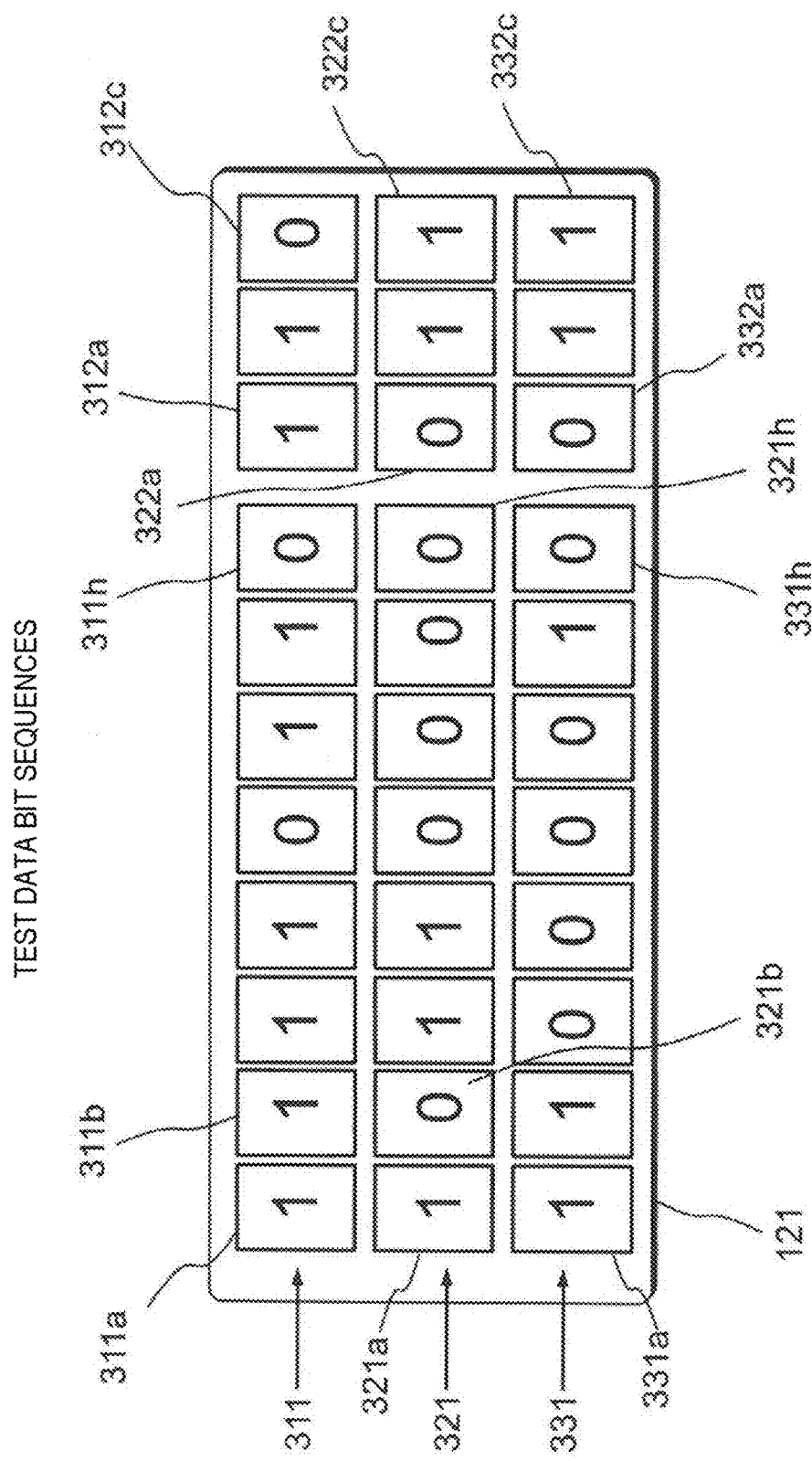
Figure 3C:
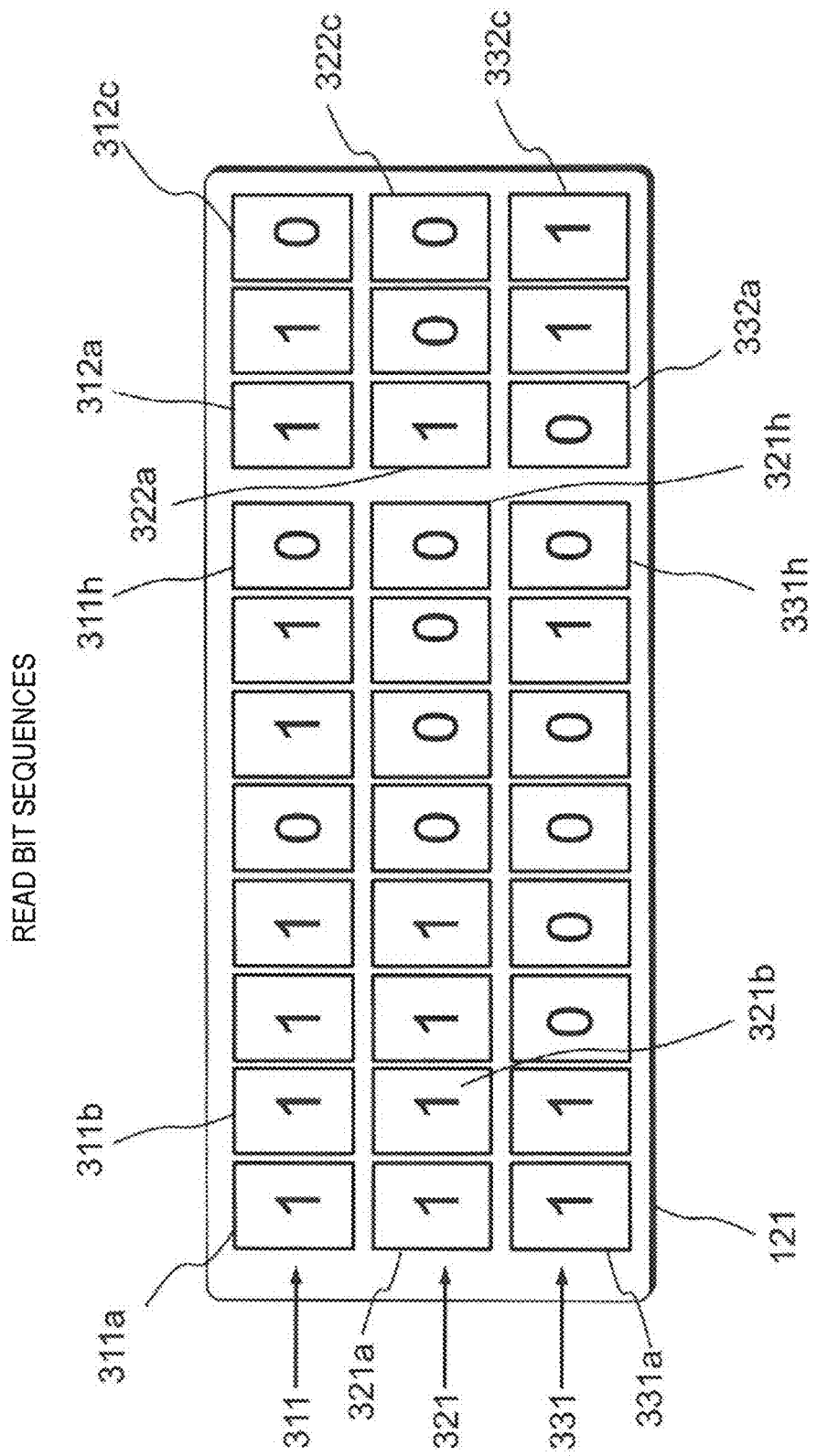
Figure 4A:
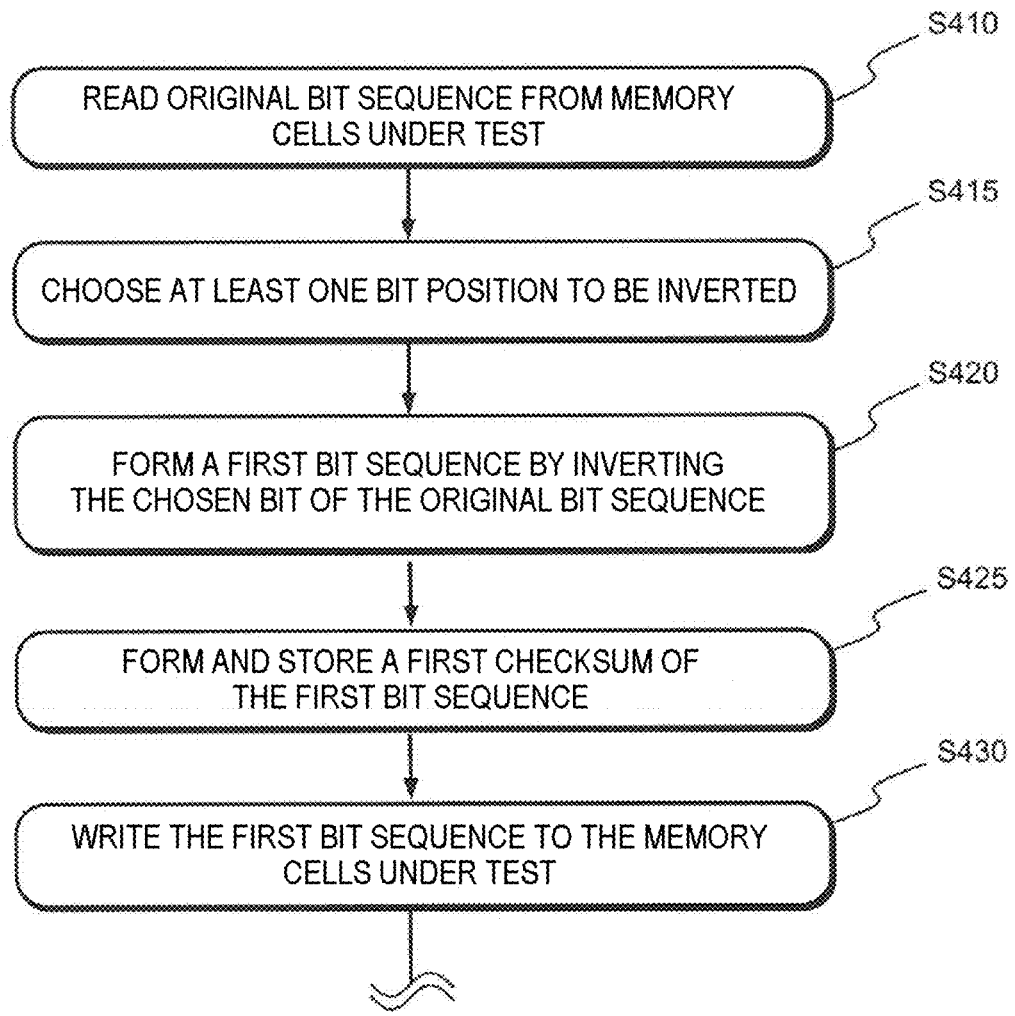
FIGS. 4A and 4B show a flow diagram which represents a method segment of the method shown in FIG. 2 using the processor shown in FIG. 1 according to some embodiments.
Figure 4B:
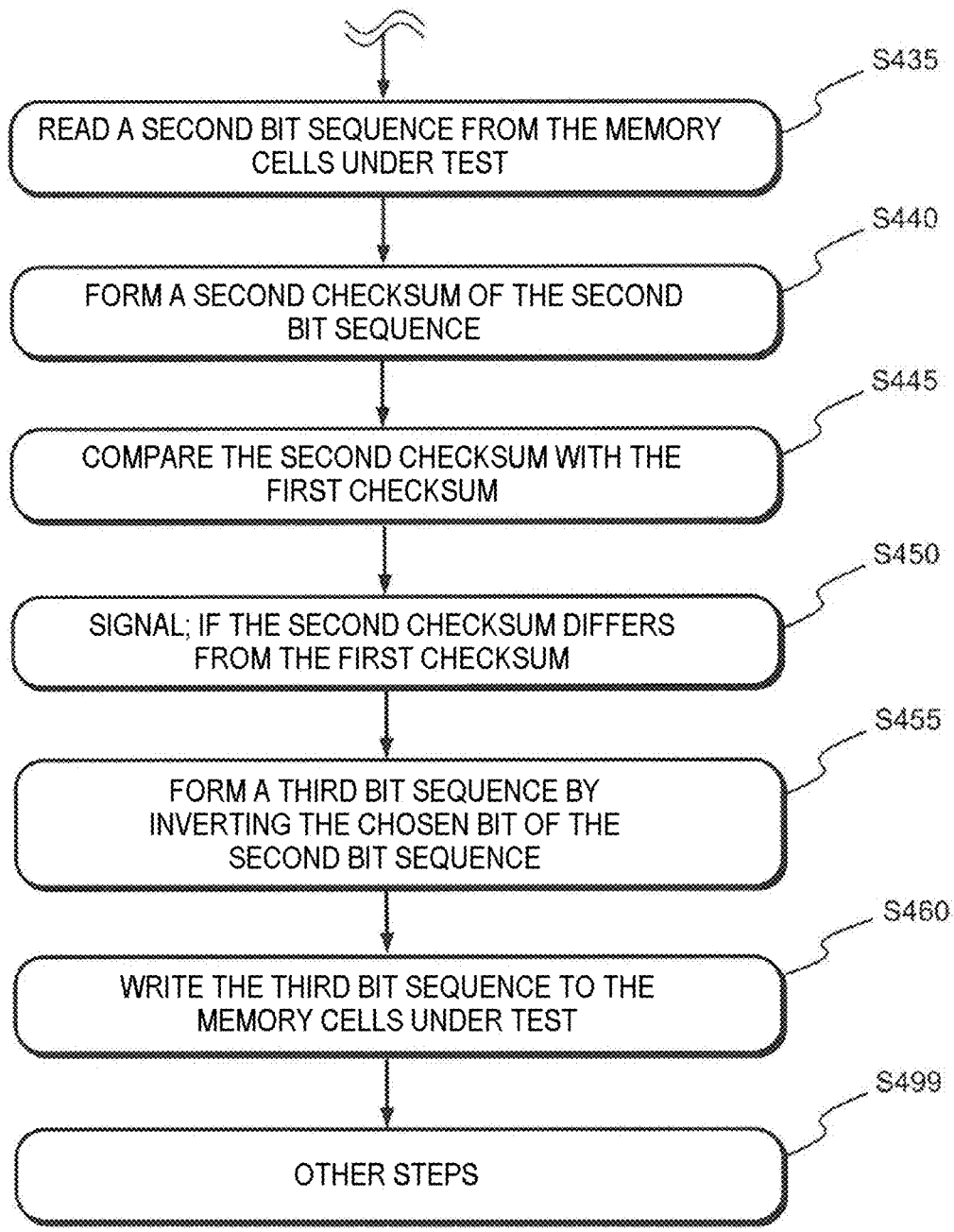

FIGS. 3A, 3B and 3C are block diagrams which schematically represent, for example, a section from the memory sector 121 according to some embodiments. The memory sector 121 has a plurality of rows 311, 321, 331 with cells 311*a*, 311*b* . . . 311*h*, 312*a* . . . 312*c*, 321*a* . . . 322*c*, 331*a* . . . 332*c*. The cells may be individually addressable. Depending on the memory type, each cell can store at least one bit. Although the area of the memory sector shown has three rows, each having eight plus three memory cells, it should be understood that the number of memory cells may differ from the example shown. The memory sector may, for example, have 1024 rows with 32 plus eight cells per row. It should furthermore be understood that each memory sector 121, 122, 123 does not have to be structured in the same way. A first memory sector, for example, may have 512 rows with 32 plus eight cells per row, whereas a second memory sector may have 512 rows with 16 plus four cells. Different memory sectors 121, 122, 123 of the memory 120 may furthermore have different memory types.

FIG. 3A shows a representation of an area of the memory sector 121 in which the cells 311*a* . . . 311*h* of a first row 311 of the area of the memory sector 121 shown store a data bit sequence 1 0 1 1 0 1 1 0. The first row of the area of the memory sector 121 shown is referred to as the top row 311 in the description below. The bit sequence in the top row 311 of the memory sector is furthermore also referred to below as the original bit sequence, whereas FIG. 3B and FIG. 3C show other bit sequences which may be significant during a test of the memory sector 121 in respect of the memory sector 121, as will become clear from the description below. The other bit sequences are referred to below as test data bit sequences.

The processor 100 is configured to determine a signature on the original bit sequence with the formation of a checksum. The term checksum herein means a number of bit values of a predefined selection of bit positions, e.g. of a data word or selected data word segment. In the example shown in FIG. 3A, the cells 312*a* . . . 312*c* of the top row 311 of the area of the memory sector 121 shown accordingly store a check bit sequence 1 0 1. The check bit sequence 1 0 1 forms an original signature on the original bit sequence 1 0 1 1 0 1 1 0. The check bit sequence represents, for example, a checksum of the ones of the original data bit sequence 1 0 1 1 0 1 1 0. Other test data bit sequences can be stored in the cells 311*a* . . . 311*h*. Other check bit sequences can also be stored accordingly in the cells 312*a* . . . 312*c*. The bit sequence stored in the cells 312*a* . . . 312*c* may have a relationship to the original bit sequence other than to represent a checksum of the ones. A deviation, for example, of the representation of the stored original bit sequence from a mean checksum may be coded or a checksum may represent the number of zeros in the original bit sequence.

To cite further examples, a further original bit sequence 1 1 1 1 0 0 0 0 is shown by way of example in a second row 321 which is referred to as the middle row 321 in the description below. And a further original bit sequence 1 0 0 0 0 0 1 0 is also shown by way of example in a third row 331 which is referred to as the bottom row 331 in the description below. It should be understood that, depending on the embodiment, the tested memory sector 121 may have fewer or more rows than the area of the memory sector 121 shown. In some embodiments, rows of the memory sector 121 are electively tested. A test can thus be restricted in some embodiments to a subset of the set of rows or memory addresses of the memory sector 121.

Corresponding to the cells 312*a* . . . 312*c* of the top row 311, the cells 322*a* . . . 322*c* of the middle row 321 of the area of the memory sector 121 shown store a bit sequence 1 0 0. In the example, the check bit sequence 1 0 0 represents a checksum of the ones of the original bit sequence 1 1 1 1 0 0 0 0 in the cells 321*a* . . . 321*h* of the middle row 321. And the cells 332*a* . . . 332*c* of the bottom row 331 of the area of the memory sector 121 shown furthermore also store a check bit sequence 0 1 0 accordingly which, in the example, represents a checksum of the ones of the original bit sequence 1 0 0 0 0 0 1 0 in the cells 331*a* . . . 331*h* of the bottom row 331. It should be understood that the original bit sequences specified here in the top row, the middle row and the bottom row of the area of the memory sector 121 shown are randomly chosen in order to give an example.

The memory sector 121 which comprises eight plus three cells per row 311 in the example shown can store, in each row, any other values which are representable with eight bits. The memory sector 121 which comprises eight plus three cells per row in the example shown can furthermore store, in each row, any other signatures which are representable with three bits. In a different embodiment (not shown), the memory sector 121 comprises, for example, eight plus four memory cells. The memory sector can accordingly store a check code with four bits per row. In some instances, the check code may also enable, for example, an error correction in addition to an error detection if, for example, an error correction code is used.

The ALU 110 is connected by means of the bus 112 to the memory 120 in such a way that the ALU 110 can write data to the memory 120 and read data from the memory 120. In particular, the ALU 110 can write data to the cells 311a . . . 332c of the plurality of memory sectors 121, 122, 123 and/or read data from the cells 311a . . . 332c. The processor 100 is configured, for example, to read an original bit sequence from the memory cells 311a . . . 311h under test. In some embodiments, the processor 100 is connected to a program memory (not shown) in which a program is stored whose execution prompts the processor to read the original bit sequence from the memory cells under test. The original bit sequence may be any data which are written to the memory 120 according to a provided function of the processor in the operation of the processor 100.

In some embodiments, the process is configured to form a first test data bit sequence on the basis of the original bit sequence. In one embodiment, the processor is configured to select a bit of the original bit sequence and invert the selected bit. The processor may select, for example, the second bit of the original bit sequence in order to invert this bit. In the aforementioned example of the original bit sequence 1 0 1 1 0 1 1 0, the processor may accordingly generate the first test data bit sequence 1 1 1 1 0 1 1 0.

In one embodiment (not shown), the processor is configured to select more than one bit which will be inverted. The bit is, for example, randomly selected. The processor 100 is configured to store, for example in the register 130 for special purposes, information indicating which bit position, i.e. which bit, is selected for the inversion, so that the information relating to the selected bit is available for further processing during the further course of the test. In the present example, the processor 100 is configured to store the information indicating that the second bit is selected for the inversion. In some embodiments, the processor is optionally configured to store the original and/or the inverted value of the selected bit, for example in the register 130 for special purposes, so that the original or the inverted value is available for further processing in the further course of the test.

In some embodiments, the processor 100 is configured to determine a first test data signature on the first test data bit sequence with the formation of a first checksum. In the example shown in FIG. 3B, the cells 312a . . . 312c of the top row 311 of the area of the memory sector 121 shown accordingly store a check bit sequence 1 1 0. The check bit sequence 1 1 0 forms a first test data signature on the test data bit sequence 1 1 1 1 0 1 1 0. The check bit sequence represents, for example, a checksum of the ones of the test data bit sequence 1 1 1 1 0 1 1 0. Other test data bit sequences can be stored in the cells 311a . . . 311h. Other test data check bit sequences can also be stored accordingly in the cells 312a . . . 312c. The test data check bit sequence stored in the cells 312a . . . 312c may have a relationship to the test data bit sequence other than to represent a checksum of the ones. A deviation, for example, of the representation of the stored test data bit sequence from a mean checksum may be coded or a checksum may represent the number of zeros in the original bit sequence.

The processor 100 is configured to write the first test data bit sequence in place of the original bit sequence to the memory cells under test. FIG. 3B shows by way of example a representation of the memory sector 121 in which, insofar as the memory sector functions without error, the cells 311a . . . 311h of the top row store the first test data bit sequence 1 1 1 1 0 1 1 0 resulting from inversion of the second bit from the original bit sequence 1 0 1 1 0 1 1 0.

The processor 100 is furthermore configured to read a second test data bit sequence from the memory 120 in place of the original bit sequence or the first bit sequence. FIG. 3C shows by way of example a representation of the memory sector 121 from which, in the top row, the content of the cells 311a . . . 311h, the second test data bit sequence 1 1 1 1 0 1 1 0, is read. In some embodiments, the processor 100 is furthermore configured to determine a second test data signature on the second test data bit sequence with the formation of a second checksum. In the present example, the check bit sequence 1 1 0 represents the second checksum. If the write procedure, the storage and the read procedure function without error, the second test data bit sequence which is read from the memory cells 311a . . . 311h of the memory sector 121 corresponds identically to the first test data bit sequence which has been programmed in the same memory cells 311a . . . 311h of the memory sector 121.

In some embodiments, the processor 100 is configured to compare the second checksum 1 1 0 with the first checksum 1 1 0. The processor 100 is furthermore configured to signal a result of the comparison. The processor 100 may, for example, output an error signal if and only if the second checksum is not equal to the first checksum. In some embodiments, the processor 100 is configured to output a confirmation signal if and only if the second checksum 1 1 0, as in the present example, is equal to the first checksum 1 1 0. At least one effect may be that a user interprets the signal of the processor 100 as an indication of a memory error if the signal is an error signal or if the user detects no confirmation signal. At least one effect may be that the signal of the processor 100 is available to the user, for example, in order to be further processed in a statistical evaluation which, on the basis of the inverted bit positions, serves to localize a probable cause of the error.

The processor 100 is configured to form a third bit sequence 1 0 1 1 0 1 1 0 by inverting at least one selected bit of the second test data bit sequence. In particular, the processor can invert precisely that bit or those bits which the processor 100 has inverted in order to extract the first test data bit sequence from the original bit sequence. The processor 100 is furthermore configured to write the third bit sequence to the memory cells 311a . . . 311h under test in place of the original bit sequence or in place of the first bit sequence. At least one effect may be that the user was able to carry out the test without knowing the content of the memory itself. The user has in fact stored the first test data signature, in particular the first checksum, for example in the register 130 for special purposes, and has compared it with the second test data signature, in particular with the second checksum. In the test, however, the user can dispense with writing the original bit sequence, the first test data bit sequence, the second test data bit sequence or the third bit sequence to a location other than the memory cells 311a . . . 311h under test.

In one embodiment, the processor 120 is configured to process the bits of the original bit sequence, the bits of the first test data bit sequence, the bits of the second test data bit sequence and the bits of the third bit sequence in each case serially, for example in order to determine the signature, so that the user at no time stores a complete representation of the original bit sequence, the first test data bit sequence, the second test data bit sequence or the third bit sequence in a register of the ALU 110 or even in the memory 120 of the processor 100. Generally speaking, a method for testing memory cells under test of an integrated circuit comprises: allocating an access value to a memory access and granting an access credit. According to some embodiments, a check is carried out to determine whether the access value of the memory access exceeds the access credit. If the access value of the memory access does not exceed the access credit, the method comprises: reading an original bit sequence from the memory cells under test, reducing the access credit by the access value and forming the first bit sequence by inverting at least one bit from at least one selected bit position of the original bit sequence.

The method furthermore comprises: determining a first signature on a data word segment of a first bit sequence and writing the data word segment of the first bit sequence to the memory cells under test. In some embodiments, the formation of the first signature comprises one or more of: determining the checksum on the data word segment, determining a hash on the data word segment, determining an error correction code (ECC) for the data word segment, and determining a checksum for the data word segment.

According to the method, a check is carried out to determine whether the access value of the memory access exceeds the access credit. If the access value of the memory access does not exceed the access credit, the method comprises: reading a second bit sequence from the memory cells under test and reducing the access credit by the access value and forming a second signature on a second bit sequence. The second signature is formed according to the first signature.

Some embodiments of the method comprise: signaling if the second signature differs from the first signature. Some embodiments of the method comprise: signaling if the second signature matches the first signature. The method may also comprise both steps of the signaling, since the respective signaling is conditional, and the conditions are mutually exclusive so that, depending on the presence of one of the two conditions, according to the method either the presence of one condition or the presence of the other condition is signaled.

An example embodiment of memory accesses in a test method, also referred to summarily herein as test access, is described below according to some implementations. According to the method described above with reference to FIG. 2, in some embodiments the access value $D\_p$ of the planned test access is determined at S210, for example, in respect of a number of bit positions under test. The more bit positions that are intended to be subjected to the test access, for example, the greater the access value $D\_p$ of the planned access. At S240, it is established in some embodiments that the access value $D\_p$ of the planned test access does not exceed the credit C. The counter reading Z is reduced accordingly by the value $D\_p$ and the test access to the bit under test is performed at S270. The test access at S270 forms a method part of the method shown in FIG. 2. Details of some embodiments of the method which relate, in particular, to the test access at step S270 will now be described with reference to the flow diagram shown in FIGS. 4A and 4B, wherein reference is also made to FIGS. 1 and 2, and also 3A, 3B and 3C.

At S410, an original bit sequence is read from the memory cells under test. The original bit sequences 1 0 1 1 0 1 1 0 (top original bit sequence), 1 1 1 1 0 0 0 0 (middle original bit sequence) and 1 0 0 0 0 0 1 0 (bottom original bit sequence), for example, are read from the area of the represented memory sector 121, as shown in FIG. 3A.

At S415, a bit position is chosen whose bit value is to be inverted. The second bit position, for example, is chosen. The bit position can be randomly chosen, particularly if the method steps described below are carried out repeatedly in order to collect statistical data relating to the memory cells under test.

At S420, a first bit sequence is formed by inverting one bit at the selected bit position of the original bit sequence. In the example described, as shown in FIG. 3B, the bit sequences 1 1 1 1 0 1 1 0 (top test data bit sequence), 1 0 1 1 0 0 0 0 (middle test data bit sequence) and 1 1 0 0 0 0 1 0 (bottom test data bit sequence) are thus obtained by inverting the bit at the second bit position. In some embodiments, the original bit sequences are deleted from other registers of the CPU 100, so that the CPU 100 does not store the original bit sequences entirely outside the memory cells 311a . . . 331h of the CPU 100.

At S425, a first test data signature on a data word segment of the first bit sequence is determined. The user, for example, selects the data word segment. In some embodiments the choice is predefined. In the example shown, the data word segment comprises the entire data word. In the example shown, the first test data signature comprises the checksum relating to the ones in a binary representation of the data word. First test data checkbit sequences 1 1 0 (top test data checkbit sequence), 0 1 1 (middle test data checkbit sequence) and 0 1 1 (bottom test data checkbit sequence) are determined accordingly in respect of the test data checkbit sequences.

In some embodiments, as already explained, the formation of the first signature comprises determining the checksum on the data word segment. In some embodiments, the formation of the first signature comprises determining a hash on the data word segment (not shown). In some embodiments, the formation of the first signature comprises determining an error correction code (ECC) for the data word segment (not shown). In some embodiments, the formation of the first signature comprises determining a checksum for the data word segment (not shown). In some embodiments, the formation of the signature also comprises a combination of two or more of the aforementioned steps (not shown).

In some embodiments, the formation of the first bit sequence comprises determining the signature. In this embodiment, the first bit sequence comprises at least the data word segment and the signature. In the example explained, the first test data bit sequence for the first row 311 of the memory sector 121 accordingly comprises the bits 1 1 1 1 0 1 1 0 1 1 0. The first test data bit sequence for the second row 321 of the memory sector 121 comprises the bits 1 0 1 1 0 0 0 0 1 1, and the first test data bit sequence for the third row 331 of the memory sector 121 comprises the bits 1 1 0 0 0 0 1 0 0 1 1.

Still at S425, the first test data signature, i.e. the top test data checkbit sequence 1 1 0, the middle test data checkbit sequence 0 1 1 and the bottom test data checkbit sequence 0 1 1, are stored in register 130 of the processor 100. In some embodiments, the test data checkbit sequences are deleted. In an alternative embodiment, if the bit sequence comprises both the data word segment and the signature on the data word segment, the signature no longer needs to be stored in the register 130 of the processor 100.

At S430, the data word segment of the first bit sequence is written to the memory cells under test of the memory sector 121. A prerequisite for error-free writing of the respective bit sequence to the memory cells 311a . . . 332h under test of the memory sector 121 is that the memory cells 311a . . . 332h can be programmed.

At S435, a second bit sequence is read from the memory cells under test. If the write procedure, the storage and the read procedure function without error, the second test data bit sequence which is read from the memory cells 311a . . . 311h of the memory sector 121 corresponds identically to the first test data bit sequence which was programmed in the same memory cells 311a . . . 311h of the memory sector 121. However, one effect of the teaching disclosed here is that a direct comparison of data words read from the memory cells 311a . . . 311h, 321a . . . 321h, 331a . . . 331h with data words written in each case to the same memory cells 311a . . . 311h, 321a . . . 321h, 331a . . . 331h is not required, as the further explanation shows. In the alternative embodiment with the test data bit sequence, if the bit sequence comprises both the data word segment and the signature on the data word segment, the signature on the data word segment of the test data checkbit sequence is also read from the memory cells 312a . . . 312c, 322a . . . 322c, 332a . . . 332c.

At S440, according to the first test data signature on the first test data bit sequence, a second test data signature is formed on a data word segment of the read second test data bit sequence. A choice of the data word segment of the second test data bit sequence corresponds to the choice of the data word segment of the first test data bit sequence. In the example, the test data signature corresponds to the checksum of the ones of the second test data bit sequence. In the example explained, the read second test data bit sequence for the top row 311 of the memory sector 121 comprises the data word segment 1 1 1 1 0 1 1 0, and the bits 1 1 0 are determined accordingly as the representation of the checksum as the second test data signature for the data word segment. The read second test data bit sequence for the middle row 312 of the memory sector 121 furthermore comprises the data word segment 1 0 1 1 0 0 0 0, and the bits 0 1 1 are determined accordingly as the representation of the checksum as the second test data signature for the data word segment of the middle row. And for the bottom row 313, the read second test data bit sequence comprises the data word segment 1 1 0 0 0 0 1 0 in the example. The bits 0 1 1 are similarly determined accordingly as the representation of the checksum as the second test data signature for the test data signature for the data word segment of the bottom row.

At S445, the second test data signature is compared with the first test data signature. In the present example, the representation of the second checksum is compared with the representation of the first checksum. In the example, the second test data signature and the first test data signature are compared with one another, i.e. for the top row 1 1 0 with 1 1 0, for the middle 0 1 1 with 1 0 0 and for the bottom row 0 1 1 with 0 1 1.

At S450, it is signaled if the second checksum differs from the first checksum. In some embodiments, it is signaled if the second checksum is equal to the first checksum. In some embodiments, the signaling if the second checksum differs from the first checksum, or the signaling if the second checksum matches the first checksum comprises forming a signal which represents whether the second signature does or does not differ from the first signature. In the example shown, in some embodiments it is signaled for the top row that the second checksum is equal to the first checksum. No error has thus been detected. This does not necessarily mean that errors which cancel one another could not have occurred in the procedures of writing, storing and reading the data word to the memory cells 311a . . . 311h. In the example shown, in some embodiments it is signaled for the middle row that the second checksum is not equal to the first checksum. In the selected example, the second bit inverted in relation to the original value has not been programmed into the cell 321b of the memory sector, and for this reason the read test data bit sequence produces a test data signature differing from that of the first test data bit sequence which was used at S430 to write to the cells under test. An error of this type, in which the stored value "1" cannot be deleted from a memory cell, is also referred to below as a "stuck-at-1-error". In the example shown, it is signaled for the bottom row that the second checksum is equal to the first checksum. No error has therefore been established for the bottom row 331.

Some embodiments of the method comprise forming a third bit sequence. The formation of the third bit sequence may comprise inverting the bit at the selected bit position of the second bit sequence. At S455, for example, the bit or bits is/are inverted accordingly at the bit positions of the second bit sequence at which the bit or bits of the first bit sequence has/have already been inverted in order to obtain the second bit sequence. The bit sequence resulting from the bit inversion forms a third bit sequence. In some example embodiments, the formation of the third bit sequence comprises determining a third signature on the data word segment of the original bit sequence or the third bit sequence. At least one effect may be that the third bit sequence with the third signature forms a third data word which is written to the memory 120. In the example shown, the third bit sequence 1 1 1 1 0 1 1 0, which corresponds to the original bit sequence of the top row 311, is produced in some example embodiments for the top row 311 through inversion of the second bit of the second test data bit sequence 1 0 1 1 0 1 1 0. The third bit sequence 1 0 1 1 0 0 0 0 is formed accordingly for the middle row, and the third bit sequence 1 0 0 0 0 0 1 0 is formed for the bottom row 331. The third bit sequence for the middle row does not correspond at the second bit position to the original bit sequence, since, in the present example, the second test data bit sequence for the middle row 321, as explained above, already does not correspond to the first test data bit sequence for the middle row 321. In contrast, the third bit sequence for the bottom row 331 corresponds to the original bit sequence for the bottom row 331.

In some embodiments, the method comprises writing the third bit sequence to the memory cells under test at the position of the first bit sequence. Accordingly, at S460, for example, the third bit sequence for the top row 311, the middle row 321 and the bottom row 331 are written to the cells under test 311a . . . 331h of the memory 120.

At S499, the method continues with the remaining steps. With reference to the example according to FIG. 2, this means that a query is performed at S280 to determine whether a further memory access, i.e. a further test access, is to be performed. At least one effect of the method explained above on the basis of an example may be that individual bit positions of the memory 120 can be tested, not only without giving a tester direct insight into the data written to the memory, but also without affording indirect insight, for example through a statistical evaluation or use of error correction methods, beyond the limits which the access credit C sets. At least one effect may also be that the memory 120 can be tested without having deleted the data finally from the memory.

In some embodiments of the method, the writing of the second test data bit sequence and the third test data bit sequence comprises writing a memory dump of a sector 121 of the memory 120 which comprises the memory cells 311*a* . . . 332*c* under test to a buffer memory. The writing further comprises deleting the sector 121 of the memory 120 and writing the memory dump to the sector 121 of the memory 120 wherein, in respect of the memory cells 311*a* . . . 311*h* under test, the second bit sequence or the third bit sequence is programmed into the memory cells under test 311*a* . . . 311*h* instead of data from the memory dump.

In some embodiments, all steps or a selection of the steps of reading an original bit sequence at S410, choosing at least one bit position to be inverted at S415, forming a first bit sequence on the basis of the original bit sequence at S420, forming the first checksum at S425, writing the first bit sequence to the memory cells under test, reading the second bit sequence from the memory cells under test at S435, and forming the second checksum of the second bit sequence for different data word segments at S440 are repeated. If the test access steps are performed repeatedly, the method may furthermore comprise: gathering statistical data relating to a match and/or a difference between the first checksum and the second checksum depending on the different data word segments. At least one effect may be to detect statistically significant memory cells depending on a choice of a significance criterion, said memory cells not appearing to be programmable with the same (low) voltage as statistically insignificant memory cells.

In the example described above, the memory sector 121 has been examined with a stuck-at-1 error of an individual memory cell 321*b*. In another example, a bit line error can be found, according to which, for example, in the case of an error in a second bit line, the write procedure for each bit fails at the second bit position. Any test in which a bit at the second bit position is inverted can in fact then produce an error in terms of a data word which is programmed into the memory sector 121.

In another further example, a word line error can be found. If, for example, the word line which controls cells of the middle row 321 in the area of the memory sector 121 shown is errored in such a way that the write procedure for each bit of the middle row fails, any test in which a data word which does not have as many ones as zeros can produce an error in terms of the checksum for the middle row 321.

As mentioned above, a signature can be used which comprises an error correction code (ECC) for the data word segment. If the processor is generally configured to perform an error correction, the processor 100 is, however, configured in one embodiment specifically to carry out the method according to the present disclosure without using the error correction. As in the example set out above, in which a memory cell 321*b* in the memory sector 121 has a stuck-at-1 error, the error would already be corrected by means of the error correction even before the checksum was formed over the read bit sequence; the error would thus remain unnoticed.

In one embodiment of the method, in addition to a bit representation of a datum, the data word itself also comprises an error correction code for the bit representation. In this embodiment, the checksum can be applied to the entire representation of the datum and the error correction code. In one embodiment, the processor 100 stops the error correction if the second data word is read from the memory 120 under test, in order to prevent the error correction from masking an existing error so that the error remains hidden.

In one embodiment, the processor 100 is configured to use different error correction methods in succession. In particular, the processor 100 is configured not to stop the error correction in the event of a repeated application of the test using the different error correction methods. At least one effect of a method carried out according to this example embodiment may be that an efficacy of the different error correction methods can be compared if the memory is defective.

In one embodiment, the test comprises carrying out the writing or programming of the memory cells 311*a* . . . 331*h* with an operating voltage or an operating current which differs from an operating voltage or an operating current which the user uses in a normal non-test operation of the memory 120. The processor can be configured, for example, to choose a programming voltage which is lower than in normal operation in order to determine a tolerance of the tested memory 120 to a reduction of the programming voltage and/or to measure a characteristic relating to the programming for the different tested memory cells 311*a*, . . . , 331*h*.

In one embodiment, the processor 100 can be configured to reprogram a memory cell identified as defective with the recorded value on completion of the performance of the test according to the disclosure herein in that the processor 100 uses, for example, an increased programming voltage to write the value. One effect is that the processor 100 can read the value from the memory, taking account of the defectiveness of the memory cell, i.e., for example, by adjusting an evaluation of the read current and then, in one embodiment, again taking account of the memory cell defect, i.e., for example using an increased programming voltage, can write it to the memory without knowing the value.

In some embodiments, the processor 100 is configured to store the checksum in a storage medium (not shown) which is connected to the processor without itself forming part of the processor 100. In some embodiments, the storage medium is configured as a non-volatile memory which is connectable by means of an interface protocol, such as, for example, the Universal Serial Bus (USB) protocol, to the processor. At least one effect may be that a further evaluation of the checksum data at a later time, in particular on completion of the test, is possible, in particular by a third party.

As used herein, the term 'bit sequence' designates a succession of bit values.

As used herein, the term 'bit' designates the value which a bit position of a bit sequence assumes. The value is representable in each case by a term or a pair of terms or by a character or a pair of characters, for example by 1 or 0, TRUE or FALSE, plus or minus, or the like.

As used herein, the term 'inversion of a bit' designates the reversal of the value of the bit position with the bit.

Unless otherwise indicated, bits can be stored using a storage medium, e.g. as a state of a memory cell. Unless otherwise indicated, bits can be transmitted as a signal onto which the bit is impressed using a transmission medium, e.g. a transmission line.

Unless otherwise indicated, the succession of bits of a bit sequence relates only to the representation of the bits. The bits of the bit sequence can be transmitted non-successively.

Unless otherwise indicated, an immediate succession of the bits in a succession of bits of a bit sequence relates, where relevant, only to the representation of the bits. The bits of the bit sequence can be stored in non-adjacent memory cells.

As used herein, the words 'by way of example' and the wording 'for example' mean that an example is given or an embodiment is presented. A point of view specified by way of example is not necessarily to be interpreted as advantageous or preferable. On the contrary, the example serves to explain a concept or a technology on the basis of a specific possible design. The term 'technology' comprises any product of systematic action using forces of nature, depending on the context in particular 'device', 'apparatus', 'equipment', 'system', 'manufacturing product', 'computer-readable medium', 'computer program product' and 'method'.

As used herein, enumerating terms such as 'first', 'second' and the like are used to designate different elements, areas or steps. The enumerating terms, particularly in relation to the number, are not to be construed as limiting.

As used herein, the terms 'determine' and 'calculate' and also variants of the same are used interchangeably to designate any method for achieving a result on the basis of initial data through the evaluation of said data.

The invention claimed is:

1. A method for testing memory cells under test of an integrated circuit, comprising:
    allocating an access value to a memory access;
    granting an access credit;
    forming a first signature on a data word segment of a first bit sequence;
    writing the data word segment of the first bit sequence to the memory cells under test;
    if the access value of the memory access does not exceed the access credit, reading a second bit sequence from the memory cells under test and reducing the access credit by the access value;
    forming a second signature on the second bit sequence; and
    signaling if the second signature differs from the first signature, or signaling if the second signature matches the first signature.

2. The method as claimed in claim 1, wherein the formation of the first signature or the formation of the second signature comprises:
    determining a checksum on the data word segment,
    determining a hash on the data word segment,
    determining an error correction code (ECC) for the data word segment, or
    determining a checksum for the data word segment.

3. The method as claimed in claim 1, further comprising:
    forming, according to the first signature, the second signature on a data word segment of the second bit sequence.

4. The method as claimed in claim 3,
    wherein the steps of forming the first signature, writing the data word segment of the first bit sequence to the memory cells under test, reading the second bit sequence from the memory cells under test, forming the second signature of the second bit sequence for different data word segments are repeated, and
    wherein the method further comprises gathering statistical data relating to a match or a difference between the first signature and the second signature depending on the different data word segments.

5. The method as claimed in claim 3, wherein the signaling if the second signature differs from the first signature, or the signaling if the second signature matches the first signature comprises:
    forming a signal with represents whether the second signature does or does not differ from the first signature.

6. The method as claimed in claim 1, further comprising:
    if the access value of the memory access does not exceed the access credit, reading an original bit sequence from the memory cells under test;
    reducing the access credit by the access value; and
    forming the first bit sequence by inverting at least one bit from at least one selected bit position of the original bit sequence.

7. The method as claimed in claim 6,
    wherein the formation of the first bit sequence comprises forming the signature.

8. The method as claimed in claim 1, further comprising:
    forming a third bit sequence, by:
        inverting at least one bit from at least one selected bit position of the second bit sequence; and
        writing the third bit sequence to the memory cells under test at the position of the first bit sequence.

9. The method as claimed in claim 8,
    wherein the formation of the third bit sequence comprises forming a third signature on the data word segment of the original bit sequence or the third bit sequence.

10. The method as claimed in claim 8, wherein writing of the second bit sequence and writing of the third bit sequence comprises:
    writing a memory dump of a sector of the memory which comprises the memory cells under test to a buffer memory;
    deleting the sector of the memory; and
    writing the memory dump to the sector of the memory wherein, with respect to the memory cells under test, the second bit sequence or the third bit sequence is programmed into the memory cells under test instead of data from the memory dump.

11. The method as claimed in claim 6, wherein the at least one bit from the at least one selected bit position of the original bit sequence inverted to form the first bit sequence is chosen randomly.

12. The method as claimed in claim 1, wherein the first signature is formed by determining a checksum on or for the data word segment of the first bit sequence, and the checksum is stored in a special purpose register.

* * * * *